(12) United States Patent  
Marchl et al.

(10) Patent No.: US 8,113,688 B2
(45) Date of Patent: Feb. 14, 2012

(54) CONFIGURATION OF MULTIPLE LED MODULE

(75) Inventors: Werner Marchl, Barbing (DE); Werner Spath, Holzkirchen (DE); Gunter Waitl, Regensburg (DE)

(73) Assignee: Osram AG, München (DE)

( * ) Notice: Subject to any disclaimer, the term of this patent is extended or adjusted under 35 U.S.C. 154(b) by 0 days.

(21) Appl. No.: 12/984,351

(22) Filed: Jan. 4, 2011

(65) Prior Publication Data

US 2011/0095311 A1 Apr. 28, 2011

Related U.S. Application Data

(60) Continuation of application No. 12/288,376, filed on Oct. 20, 2008, now Pat. No. 7,862,211, which is a division of application No. 10/414,739, filed on Apr. 16, 2003, now Pat. No. 7,439,549, which is a continuation of application No. PCT/DE01/03858, filed on Oct. 9, 2001.

(30) Foreign Application Priority Data

Oct. 16, 2000 (DE) .................................. 100 51 159

(51) Int. Cl.
*F21V 21/00* (2006.01)

(52) U.S. Cl. ..................... 362/249.02; 362/294; 362/800
(58) Field of Classification Search ............. 362/249.02, 362/294, 373, 800
See application file for complete search history.

(56) References Cited

U.S. PATENT DOCUMENTS

| 4,773,075 | A |   | 9/1988 | Akiba et al. |
| 4,774,434 | A |   | 9/1988 | Bennion |
| 4,866,505 | A |   | 9/1989 | Roberts et al. |
| 5,003,357 | A |   | 3/1991 | Kim et al. |
| 5,008,788 | A | * | 4/1991 | Palinkas ........................ 362/800 |
| 5,184,114 | A |   | 2/1993 | Brown |
| 5,226,723 | A | * | 7/1993 | Chen ............................. 362/800 |
| 5,453,405 | A |   | 9/1995 | Fan et al. |
| 5,612,231 | A |   | 3/1997 | Holm et al. |
| 5,632,551 | A |   | 5/1997 | Roney et al. |
| 5,660,461 | A |   | 8/1997 | Ignatius et al. |
| 5,684,523 | A |   | 11/1997 | Satoh et al. |
| 5,857,767 | A |   | 1/1999 | Hochstein |
| 6,168,970 | B1 |  | 1/2001 | Burns |

(Continued)

FOREIGN PATENT DOCUMENTS

CN 1055014 10/1991

(Continued)

OTHER PUBLICATIONS

Examination report dated May 9, 2007 issued for the corresponding Japanese patent application.

(Continued)

*Primary Examiner* — Y My Quach Lee
(74) *Attorney, Agent, or Firm* — Cozen O'Connor

(57) ABSTRACT

A configuration of multiple LED modules having a plurality of LED modules that each contain a carrier that has a first main area, a second main area and at least one semiconductor layer. The first main area has a planar configuration. The LED modules also include a plurality of LED semiconductor bodies that applied on the first main area of the carrier. In addition, the multiple LED modules include a common heat sink, where the carrier of the LED modules in each case are connected to the common heat sink on the second main area.

40 Claims, 7 Drawing Sheets

U.S. PATENT DOCUMENTS

| | | | |
|---|---|---|---|
| 6,254,262 | B1 | 7/2001 | Crunk et al. |
| 6,403,985 | B1 | 6/2002 | Fan et al. |
| 6,441,943 | B1 | 8/2002 | Roberts et al. |
| 6,476,551 | B1 * | 11/2002 | Osawa et al. ............ 362/241 |
| 6,528,779 | B1 | 3/2003 | Franz et al. |
| 6,583,444 | B2 | 6/2003 | Fjelstad |
| 6,583,446 | B1 | 6/2003 | Taninaka et al. |
| 6,773,943 | B2 | 8/2004 | Oohata et al. |
| 2001/0041410 | A1 | 11/2001 | Franz |
| 2002/0176251 | A1 * | 11/2002 | Plank et al. ............ 362/800 |
| 2003/0178627 | A1 | 9/2003 | Marchl et al. |
| 2004/0026706 | A1 | 2/2004 | Bogner et al. |

FOREIGN PATENT DOCUMENTS

| | | |
|---|---|---|
| DE | 32 30 975 | 2/1984 |
| DE | 198 28 970 | 1/2000 |
| EP | 0 351 867 | 1/1990 |
| GB | 2 176 042 | 12/1986 |
| GB | 2 276 032 | 9/1994 |
| JP | 010-86573 | 3/1989 |
| JP | 2119194 | 5/1990 |
| JP | 04-59167 | 2/1992 |
| JP | 4208988 | 7/1992 |
| JP | 6064226 | 3/1994 |
| JP | 09-199756 | 7/1997 |
| JP | 10254386 | 9/1998 |
| JP | 2000-031546 | 1/2000 |
| WO | WO 84/00700 | 3/1984 |
| WO | WO 84/00799 | 3/1984 |
| WO | WO 97/48138 | 12/1997 |
| WO | WO 98/36455 | 8/1998 |

OTHER PUBLICATIONS

Takahashi, K. et al.: "Applications of a High Density LED Array Unit Fabricated on a Silicon Microreflector", IEICE Trans Electron, vol. E80-C, No. 2, 1997, pp. 285-290.

* cited by examiner

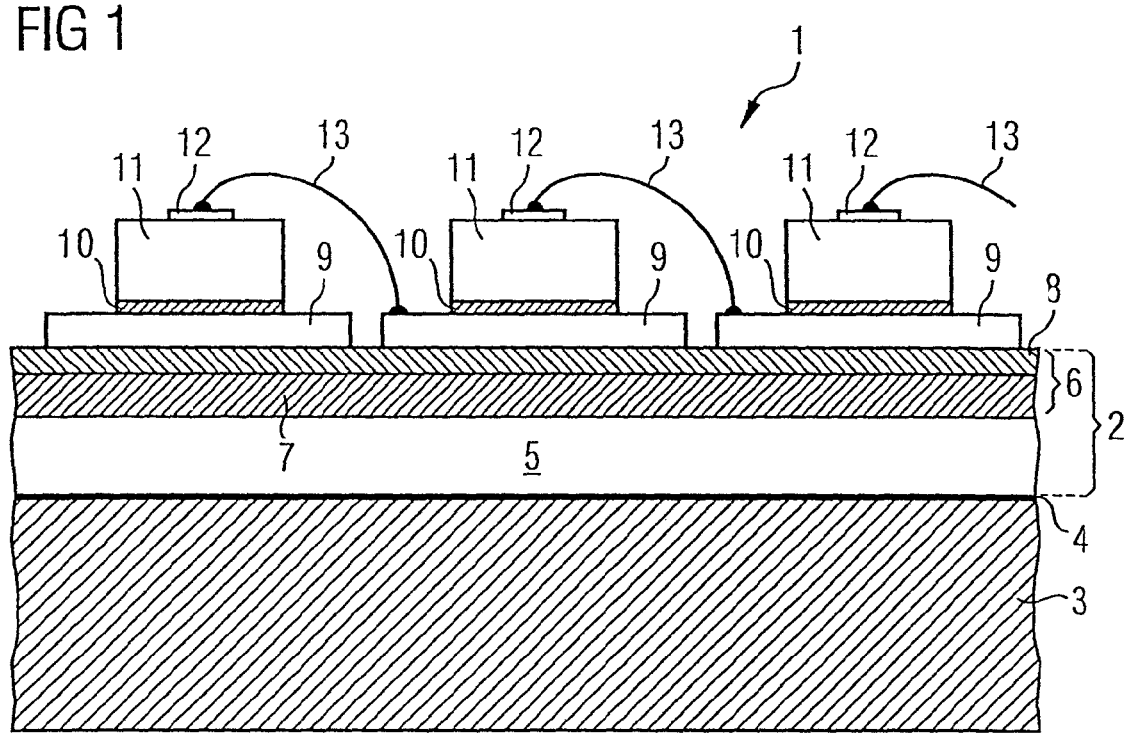

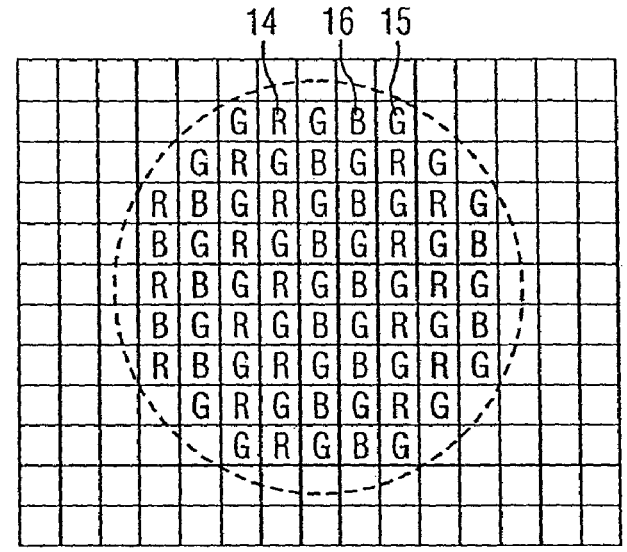
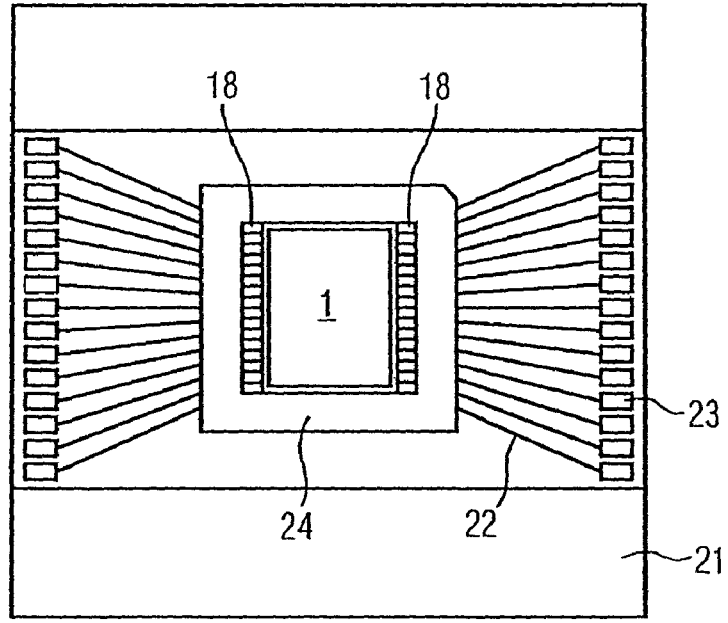

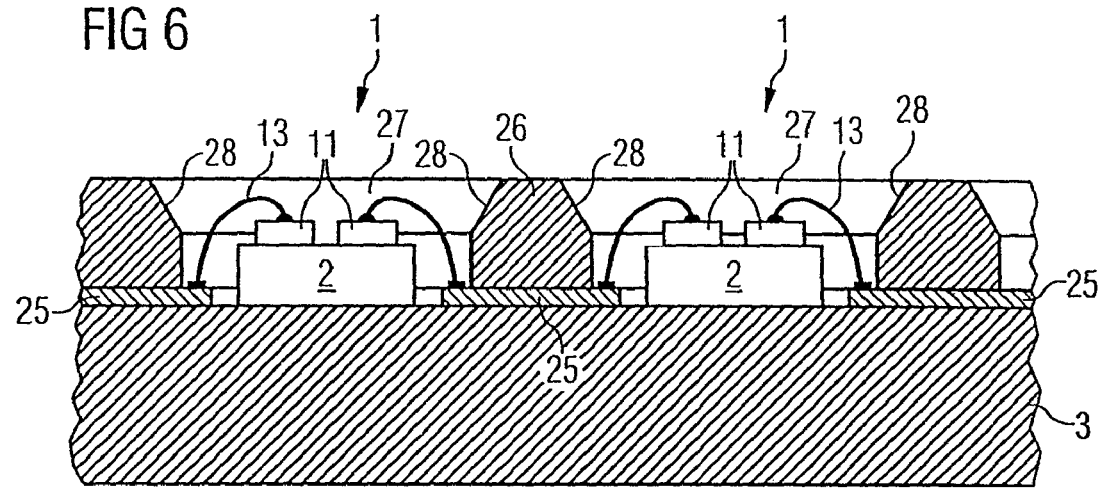

CONFIGURATION OF MULTIPLE LED MODULE

CROSS-REFERENCE TO RELATED APPLICATIONS

This patent application is a Continuation of U.S. patent application Ser. No. 12/288,376 filed Oct. 20, 2008, which is a Divisional of U.S. patent application Ser. No. 10/414,739 filed Apr. 16, 2003, which is a U.S. continuation of International Application No. PCT/DE01/03858 filed Oct. 9, 2001, which claims priority from German Application No. 100 51 159.7 filed on Oct. 16, 2000, the disclosure content of which are hereby incorporated by reference.

BACKGROUND OF THE INVENTION

1. Field of the Invention

The invention relates to a configuration of multiple light emitting diode (LED) modules, each having a plurality of LED semiconductor bodies and a carrier with a first main area, a second main area, and at least one semiconductor layer.

2. Description of the Related Art

LED modules are disclosed for example in IEICE Trans. Electron., Vol. E80-C, No. 2, February 1997, which describes an LED module having a silicon substrate, which has a plurality of etched depressions with an LED chip disposed in each of the depressions. In this case, the inclined walls of the depressions serve as a reflector for emitted radiation.

LED modules having small dimensions and a high luminance are required for many applications. These modules are suitable in particular as a semiconductor light source in conjunction with imaging optical systems such as projectors, for example.

It is possible to achieve an increase in the luminance of an LED module in principle by increasing the packing density of the individual luminous bodies, the optical output power at the same time being maintained or increased.

In the context of advancing miniaturization, one problem consists in dissipating the electrical heat generation arising in an ever-diminishing space.

SUMMARY OF THE INVENTION

It is accordingly an object of the invention to provide a configuration of multiple LED modules that overcomes the above-mentioned disadvantages of the prior art devices of this general type, which has a high luminance and the highest possible packing density of the individual LEDs and at the same time can be produced cost-effectively.

With the foregoing and other objects in view there is provided, in accordance with an embodiment of the invention, an LED module. The LED module contains a carrier having a first main area, a second main area, and at least one semiconductor layer. The first main area has a planar configuration, and a plurality of LED semiconductor bodies are applied on the first main area of the carrier.

The invention provides for a plurality of LEDs to be applied on a carrier. The carrier contains at least one semiconductor layer and the LEDs are disposed on a planar main area of the carrier. In this case "LEDs" are to be understood principally as LED chips, that is to say light emitting diode semiconductor bodies with contact areas. More widely, the invention may also use other radiation emitters. This encompasses, inter alia, besides light emitting diodes, luminescence diodes generally, for example laser diodes and super-radiators. Radiation emitters of this type are suitable in particular in the form of semiconductor bodies.

In this case, different structures are provided for electrical and thermal connection between the LEDs and the surroundings of the LED module. The electrical heat loss is dissipated principally through the carrier. For the electrical supply of the LEDs, separate conduction structures are formed, preferably on the surface of the carrier.

A particularly high packing density of the LEDs is advantageously possible as a result of the configuration of the LEDs on a planar main area of the carrier. Moreover, this enables the carrier to have a very thin embodiment, which reduces the thermal resistance of the carrier and facilitates the dissipation of the heat loss.

Silicon or gallium arsenide is preferably used as a semiconductor material for the semiconductor layer in the carrier. More widely, it is also possible to use readily thermally conductive, ceramic-like materials such as, for example, aluminum nitride or boron nitride or carbides such as, for example, silicon carbide. In the text below, the term "semiconductor" is to be understood to include these compounds and also materials that are derived therefrom and are customarily used in the production of semiconductors.

Such materials, in particular advantageously have a high thermal conductivity and are therefore highly suitable as a material for a heat-dissipating carrier. In addition, the materials mentioned are often used in the semiconductor industry and are readily available there.

The carrier is preferably bounded by an electrically insulating layer on the side on which the LEDs are applied. This prevents the LEDs from being connected in parallel, so that the LEDs can be connected up individually. More widely, it is also possible to form a plurality of insulation layers between which electrically conductive layers are disposed. In this refinement, the individual luminous bodies can advantageously be connected up in complex configurations.

The insulating layer may be formed in the form of a silicon oxide or silicon nitride layer, for example with the aid of known methods. The insulating layer is preferably embodied in a two-layer fashion, a silicon nitride layer being applied to a silicon oxide layer. The insulating layer can be made so thin that it does not impair the thermal conductivity of the carrier. Furthermore, such an insulating layer is distinguished by a high degree of insulation and a high degree of resistance to ambient influences, in particular moisture.

In a preferred development of the invention, individual, mutually isolated, conductive regions are formed on the carrier, the individual LEDs being applied to the regions directly or via intermediate layers. In this case, particular preference is attached to conductive regions having a high reflectivity, which increase the luminous efficiency of the LED module through reflection of the radiation components radiated in the direction of the carrier. Aluminum, for example, is suitable as a material for such conductive regions having high reflectivity.

A preferred refinement of the invention consists in forming chip connection regions separately on the conductive regions, the chip connection regions ensuring a permanent and secure fixing of the semiconductor bodies in conjunction with good contact-making. Chip connection regions in the form of a stack of thin metal layers are particularly suitable, the individual layers preferably containing titanium or noble metals such as gold or platinum.

In an advantageous development of the invention, the carrier is applied to a heat sink by the side that is remote from the LEDs, the heat sink preferably being formed as a metal layer or metal block. Such a metal layer has high thermal conductivity and thus improves the dissipation of heat from the LED module. The mechanical stability of the LED module is increased at the same time. It is thus advantageously possible to produce a densely packed LED module with a very high luminance and efficient heat dissipation.

Suitable materials for the heat sink are copper or aluminum, in particular on account of their high thermal conductivity. The heat sink is preferably connected to the carrier by a soldering compound or a thermally conductive adhesive, as a result of which a good heat transfer is likewise ensured.

Preferably, in the case of the invention, LEDs that in each case emit light of a different color (also referred to for short as color of the LED hereinafter) during operation are mounted on a carrier. The invention thus makes it possible to generate mixed-color light, the color of the radiated light resulting additively from the colors of the light radiated by the individual LEDs.

In this case, the color of the mixed light can advantageously be set by the individual LEDs being energized correspondingly differently.

Another possibility for defining the mixed color is to use LEDs of the same color in respectively different numbers in an LED module. The two possibilities can be used both cumulatively and alternatively, the latter having the advantage of a more uniform distribution of the operating current between the individual LEDs, while the former is more flexible during operation and enables the color locus to be set more precisely.

Particularly preferably, LEDs that emit light with a central wavelength in the red, green, and blue spectral regions are used together, for example in equal proportions, in the case of the invention. This produces an LED module that emits white light given corresponding energization with a high luminance. More widely, light of varying color can be emitted by varying the energization of the individual LEDs, large parts of the color space being covered. In particular, the white point (achromatic point, color locus $x=y=z=0.33$) can be set very precisely. Thus, the invention can be used as a white light source for generating purely white light of high intensity with no disturbing color cast.

The LED module is highly advantageously suitable as a replacement for an incandescent lamp and can be used for example as a white light source in projectors. In this case, in particular the small dimensions and the high luminance of the LED module according to the invention are advantageous.

Such an LED module is especially suitable as a light source in LCD projectors. The LCD projectors equipped with the invention can be made very compact, the light source being superior to conventional light sources with incandescent wires in respect of service life, energy consumption and heat loss arising. On account of these properties, the invention is preferably suitable in mobile use, for example in the automotive sector.

A further advantage of the invention consists in the dimmability of the LED module, i.e. the change in luminance by varying the operating current. In contrast to incandescent wires, in this case no significant spectral change in the radiated light occurs in a large luminance interval. In this case, the operating current can be varied by pulse width modulation, for example.

In an advantageous refinement of the invention, the LEDs are disposed in the form of a matrix on the carrier. This allows a high packing density of the LEDs and facilitates the automated production of the LED module.

More widely, the LEDs with the same color in each case are disposed in a regular, matrix-like pattern on the carrier. In this case, a regular configuration is to be understood as a configuration produced by one or more basic patterns being strung together in a repeated fashion. Such a configuration simplifies the driving of the LEDs and reduces the wiring outlay during production.

In order to obtain homogeneous color mixing, it is advantageous to dispose the LEDs in a periodically recurring sequence with regard to their color in the matrix rows, the LED configurations in the individual matrix rows preferably being identical or of the same type.

If the configurations in the individual matrix rows are oriented toward one another such that LEDs of the same color are in each case disposed in the matrix columns, then identical-color LEDs of a respective column can be combined very easily in series circuits.

It is particularly advantageous for the configurations in the matrix rows with an even row number (given consecutive numbering) to be displaced by one column width in each case toward the left or toward the right with respect to the configurations in the matrix rows with an odd row number. This avoids single-color columns, suppresses the formation of color artefacts and yields a particularly homogeneous color impression. At the same time, the LEDs of the same color can easily be combined by zigzag connections to form series circuits.

Other features which are considered as characteristic for the invention are set forth in the appended claims.

Although the invention is illustrated and described herein as embodied in a LED module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIG. 1 is a diagrammatic, partial sectional view of a first exemplary embodiment of an LED module according to the invention;

FIGS. 3A to 3E are diagrammatic, plan views of five variant of a third exemplary embodiment of the LED module according to the invention;

FIG. 4 is a diagrammatic, plan view of a fourth exemplary embodiment of the LED module according to the invention;

FIG. 6 is a diagrammatic, sectional view of a second exemplary embodiment of the multiple configuration according to the invention;

DETAILED DESCRIPTION OF THE PRESENTLY PREFERRED EMBODIMENTS

Figure 2A:
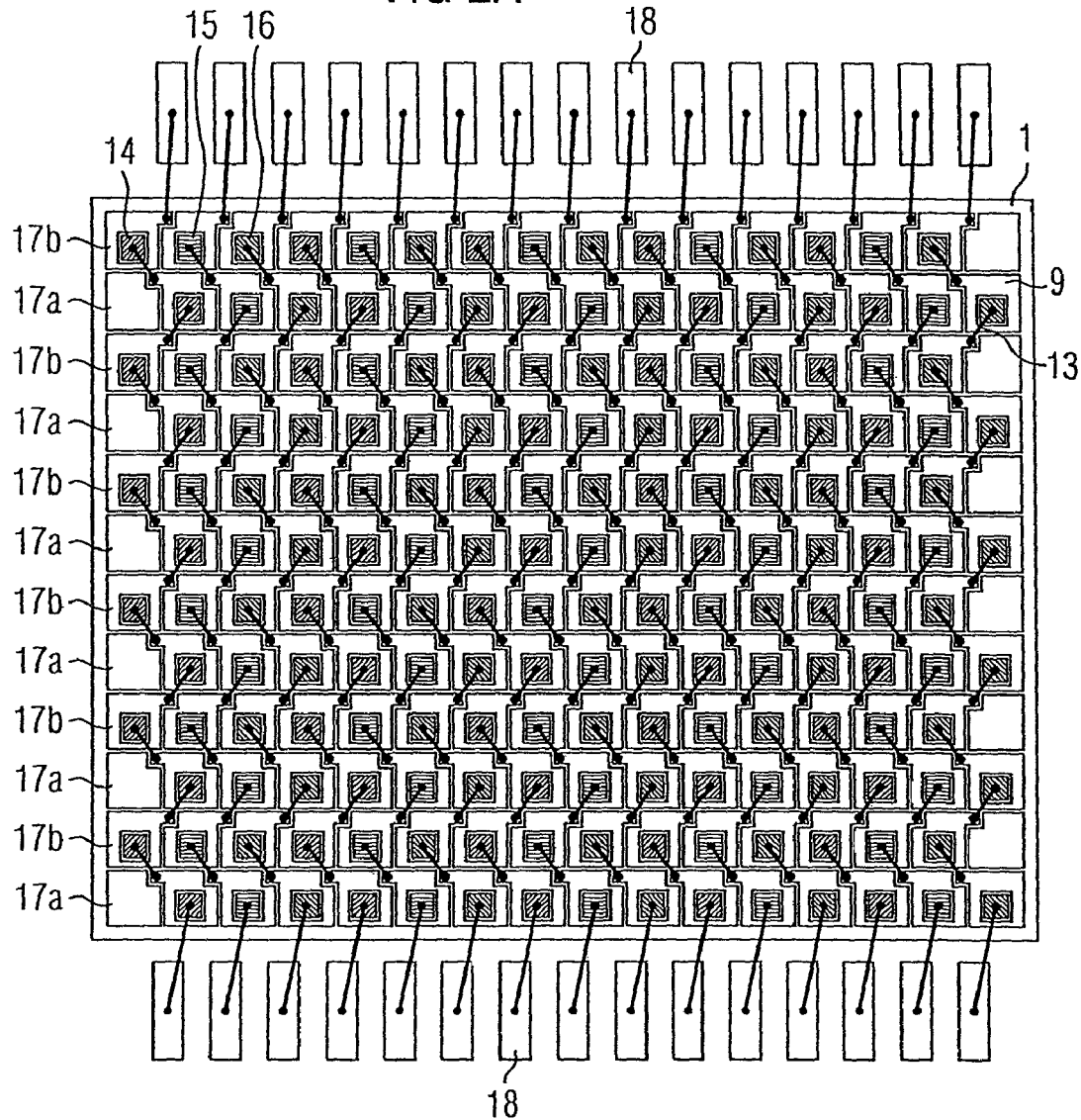
FIG. 2A is a diagrammatic, plan view of a second exemplary embodiment of the LED module according to the invention.

In all the figures of the drawing, sub-features and integral parts that correspond to one another bear the same reference symbol in each case. Referring now to the figures of the drawing in detail and first, particularly, to FIG. 1 thereof, there is shown a carrier 2 of an LED module 1 which has a silicon substrate 5, which is structured in accordance with the LED chip configuration described below and is soldered onto a heat sink 3 in the form of a copper block. A gold-tin solder is used as the solder 4, thus ensuring a mechanically stable connection and an efficient heat transfer between the silicon substrate 5 and the copper block 3. As an alternative, the silicon substrate 5 can also be connected to the copper block 3 by a thermally conductive adhesive 4.

The silicon substrate 5 is formed in a multilayered fashion. The substrate body is formed by a layer made of undoped silicon. On the latter there is applied a two-layer insulating layer 6 formed of a silicon oxide layer 7 and a silicon nitride layer 8, the silicon oxide layer 7 adjoining the substrate body.

The two-layer insulating layer 6 thus formed can easily be produced by the known methods of silicon technology and is distinguished not only by the electrical insulation property but also by a high degree of resistance, in particular to the ingress of moisture.

A plurality of mutually isolated metal areas 9 are applied to the insulating layer 6, chip connection regions 10 being formed, in turn, on the metal areas 9. The metal areas 9 are preferably composed of aluminum. The chip connection region 10 in each case has a stack formed of three thin metal layers that, as seen from the side of the silicon substrate 5, are composed of titanium, platinum and gold.

An LED semiconductor body 11 is in each case adhesively bonded onto the gold surface of the chip connection region 10 by a conductive adhesive. A soldered connection between the semiconductor body 11 and the chip connection region 10 would likewise be possible.

For further contact connection, the semiconductor bodies 11 are provided with a contact area 12 on the side remote from the carrier 2 and are interconnected by wire connections 13. The aluminum areas 9 serve both as wire connection regions, which are in each case electrically connected to that side of the mounted semiconductor body 11 that faces the carrier 2, and as reflectors for the radiation generated during operation.

In the exemplary embodiment shown, the thickness of the copper block 3 is 3.0 mm, the thickness of the silicon substrate 5 is 220 µm and the thickness of the insulating layer 6 is 0.62 µm. The aluminum layer 9 is formed with a thickness of 1.0 µm, the chip connection region 10 is formed with a total thickness of 0.3 µm. With a semiconductor body having a thickness of 200 µm, given a grid dimension of 600 µm×600 µm and a semiconductor cross section of 260 µm×260 µm, overall a thermal resistance of 177 K/W, with respect to a grid unit, is achieved.

Thus, under steady-state conditions, given a typical electrical power loss of 50 mW per LED, the temperature difference between the semiconductor surface and the carrier underside is about 8.9 K (independently of the number of grid units).

FIG. 2A shows a two-dimensional configuration of the LEDs in plan view. A total of 180 LEDs 11 are mounted on the carrier, in each case 60 LEDs with a central wavelength in the red, green, and blue spectral regions. The LEDs are disposed in the form of a matrix, a red LED 14, a green LED 15 and a blue LED 16 being disposed next to one another in a periodic sequence in each matrix row 17a, b.

In this case, the configuration's in the individual matrix rows 17a, b are oriented toward one another such that the matrix rows with an odd row number 17b each have the same configurations and so identical-color LEDs are in each case disposed below one another in the matrix rows 17b. In this case, the row number is to be understood as the number that is in each case allocated to the individual matrix rows given customary consecutive numbering of the matrix rows from top to bottom.

The configuration of the LEDs in the matrix rows 17a with an even row number corresponds to the configuration in the matrix rows 17b with an odd row number, but is displaced by one column width toward the left with respect to the matrix rows 17b with an odd row number. Only the odd-numbered matrix rows 17b are populated in the left-hand edge column and only the even-numbered matrix rows 17a are populated with LEDs in the right-hand edge column, so that each matrix row contains the same number of LEDs.

This overall configuration of the LEDs enables a wiring of the LEDs of the same color that lie below one another by a zigzag series circuit and thus a simple driving of LEDs of the same color.

Compared with a configuration in which only LEDs of the same color are disposed in the matrix columns, the configuration shown has the advantage that no continuous lines or diagonals of the same color occur. As a result, a homogeneously mixed-color radiation is achieved and the occurrence of disturbing artefacts is suppressed.

The wiring is affected in the direction of the matrix columns, the contact 12 on the semiconductor body 11 of each LED except in the last matrix row being connected by the wire connection 13 to the aluminum area 9 of the diagonally underlying LED of the same color.

The LEDs of the first and last matrix rows are connected by wire connections to contact areas 18 lying further on the outside. During operation, the LEDs of the same color that are disposed in two adjacent columns are in each case supplied with current via contact areas 18.

On account of the LED series circuit, the module can be supplied with voltages which correspond to a multiple of the LED supply voltages and which can be generated from the customary mobile on-board electric supply systems without a high outlay. Since the LED columns of the same color can be connected separately from one another, the module is advantageously still largely capable of functioning even in the event of failure of a column.

Figure 2B:
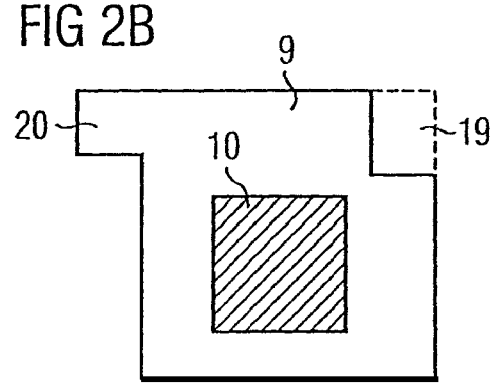
FIG. 2B is a diagrammatic, detailed plan view of a part of the second exemplary embodiment of the LED module according to the invention.

FIG. 2B shows an enlarged illustration of the aluminum area 9. The area 9 has a rectangular plan, a rectangular recess 19 being formed at one corner and an area piece 20 which corresponds to the recess 19 and is somewhat reduced in size being added to an edge opposite the corner.

This shaping enables the aluminum areas 9 to be disposed in an area-filling and mutually insulated manner. In this case, the area piece 20 forms the wire connection region for the contact connection of the semiconductor body 11 respectively applied on the aluminum area 9. The wire connection region is spaced apart from the chip connection region 10 since, during the mounting of the semiconductor body 11 onto the chip connection region 10, solder or adhesive residues may be deposited in the vicinity of the chip connection region 10 and make reliable wire contact connection more difficult.

The areas 9 disposed in the even-numbered matrix rows 17a correspond to the form shown in FIG. 2B. The areas 9 in the odd-numbered matrix rows 17b emerge from this form by horizontal mirroring. The alternate configuration of these forms enables the series circuit shown with zigzag wiring in conjunction with advantageously short wiring paths.

The LED module thus formed has an edge length of about 9 mm×10 mm and achieves a luminance of 77 kcd/m$^2$ for white light. The LED module thus constitutes a light source with adjustable color, in particular a white light source, based on LEDs with an extremely high packing density and luminance.

FIGS. 3A-3E shows further advantageous configurations with regard to the LED color. In the exemplary embodiment illustrated in FIG. 3A, the LEDs are again disposed in a periodically recurring sequence in the matrix rows. LEDs of the same color in each case are disposed in the matrix columns. Connecting LEDs of the same color in series is particularly simple in this case.

Figures 3A, 3B, 3C:
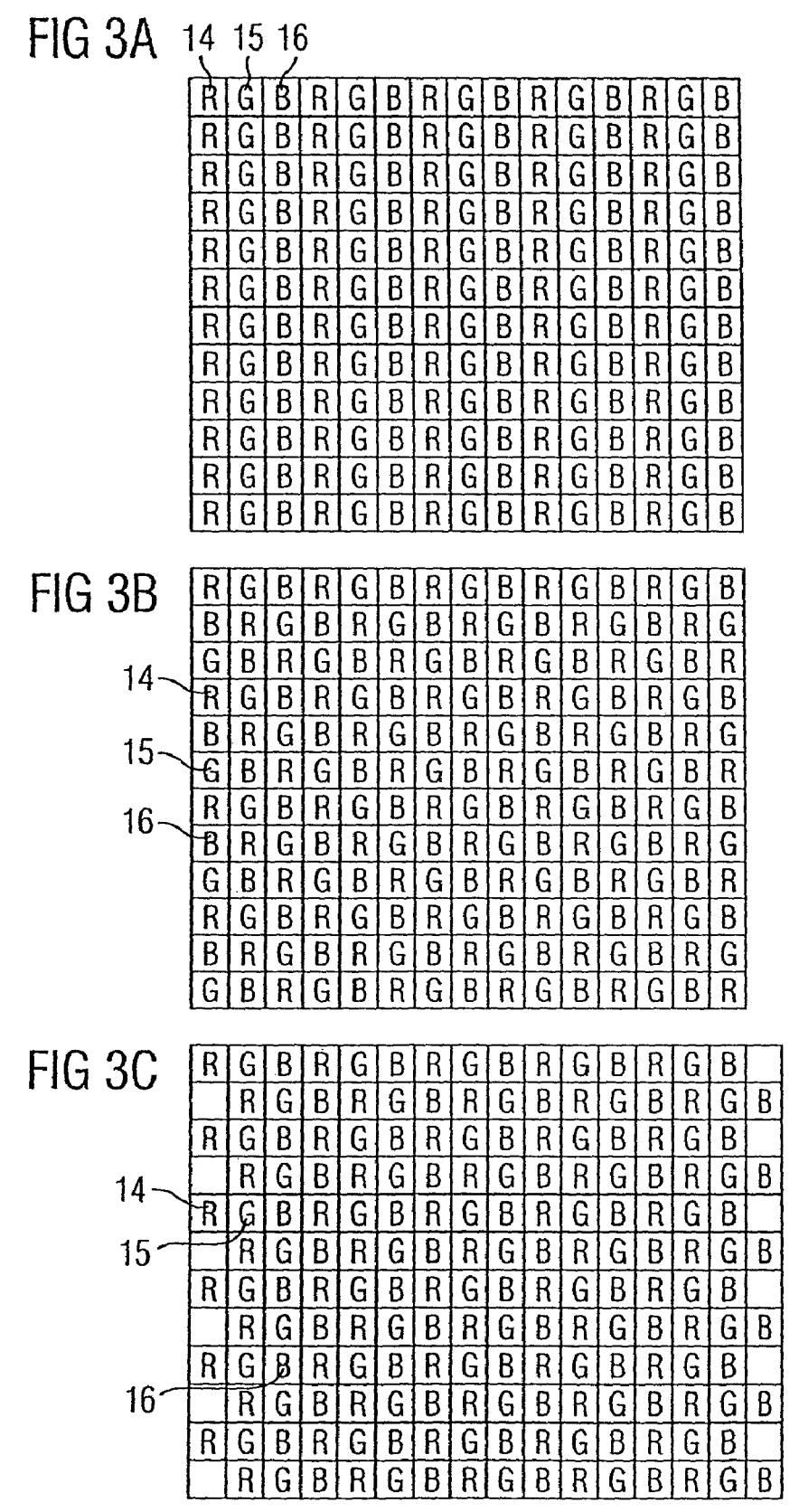

In the exemplary embodiment illustrated in FIG. 3B, the LEDs are likewise disposed in a periodically recurring sequence in the matrix rows. In this case, starting from the second row, the configuration in a matrix row results from the overlying matrix row through displacement by one column width toward the right. In this case, too, the LEDs of the same color can easily be combined by series circuits along the diagonals from top left to bottom right.

The exemplary embodiment illustrated in FIG. 3C corresponds to the configuration shown in FIG. 2A. Continuous lines of the same color have been avoided in this case, so that no disturbing artifacts can arise and a light source effecting particularly homogeneous radiation is thus formed.

It goes without saying that if is possible to use both cyclic three-way permutations of the LED colors that are illustrated in FIG. 3D. Equally, all the matrix rows can be interchanged for the corresponding columns.

In the configuration illustrated in FIG. 3E only the grid locations lying within a circular contour (broken line) are populated. This configuration is advantageous in conjunction with an optical system with a corresponding circular entrance aperture, such as that of cylindrically symmetrical optical systems, for example. The entrance aperture is illuminated uniformly by the configuration shown. At the same time by reducing the LED population to grid locations that lie within the entrance aperture, the power consumption of the LED module is advantageously lowered without thereby reducing the illumination of the optical system.

With regard to their colors, the LEDs in this exemplary embodiment are disposed in a manner similar to that in FIG. 3C, so that LEDs of the same color can be combined by a zigzag series circuit in the direction of the matrix columns. By contrast, the periodically recurring configuration along the matrix rows has been relinquished and the number of green LEDs has been increased, so that a total of 34 green, 19 red and 16 blue LEDs are used in this module. With this weighting of the number of LEDs, the LED module generates white mixed light when all the LEDs are energized identically.

Depending on the application, it is also possible to combine individual aspects of the configurations illustrated in FIGS. 3A to 3E. It goes without saying that it is also possible to use simpler circuits and configurations, for example a disordered distribution of the LED colors or a straightforward series circuit of all the LEDs. In the latter case, as in FIG. 3E, the color locus of the mixed light depends on the frequencies of the LEDs of the same color.

FIG. 4 shows an exemplary embodiment of the invention in a preassembled state. The LED module 1 is adhesively bonded or soldered onto a center of a base plate 21 made of copper. The contact connections 18 for supplying power to the LED matrix columns are led via a lead frame 22 with conductor tracks running radially outward to enlarged soldering connections 23 at the edge of the base plate, the soldering connections 23 being spaced apart and embodied such that they can easily be connected to an electronic assembly for driving the LED module 1 or supplying the latter with power.

Mounted above the lead frame 22 is a potting frame 24, whose inner region is filled with a thin potting layer, preferably made of a transparent reaction resin such as epoxy resin, for example, for the protection of the LED module 1.

Figure 5:
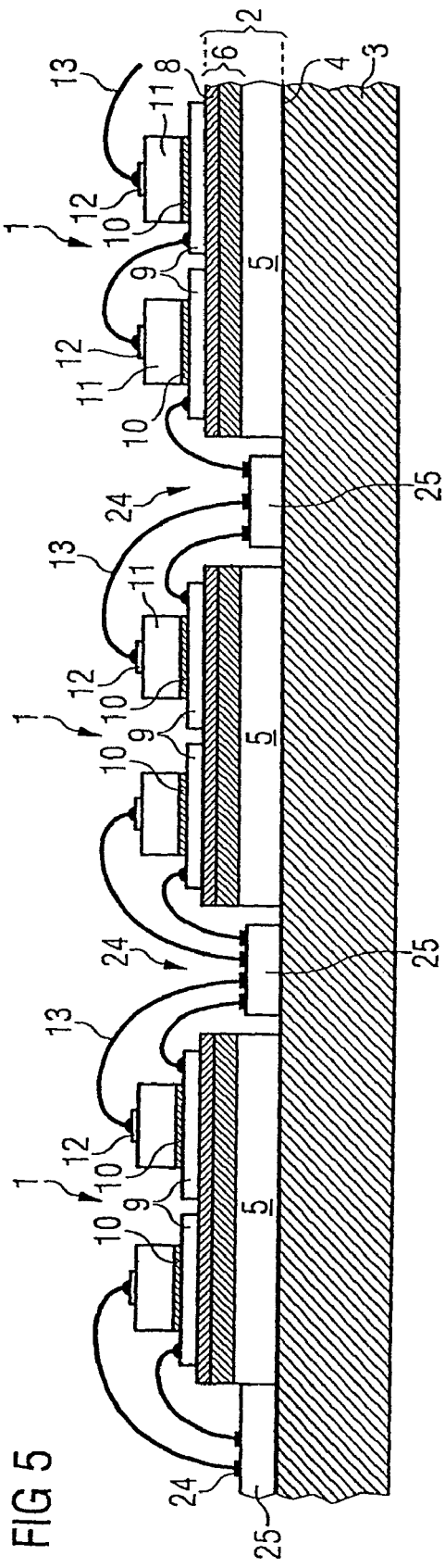
FIG. 5 is a diagrammatic, sectional view of a first exemplary embodiment of a multiple configuration having a plurality of the LED modules according to the invention.

FIG. 5 illustrates a further exemplary embodiment of the invention. In contrast to the exemplary embodiment illustrated in FIG. 1, here a plurality of the LED modules 1 are mounted onto the common heat sink 3, thereby forming a multiple configuration of the LED modules 1.

The construction of the individual LED modules 1, containing the carrier 2 with the semiconductor layer 5 and the multilayer insulating layer 6, the metal areas 9 formed on the carrier with chip connection regions 10, and LED semiconductor bodies 11 fixed thereon, essentially corresponds to the LED module shown in FIG. 1.

In this case, the number of LEDs on the individual LED modules 1 can be adapted to the individual requirements. By way of example, each LED module may contain one red LED, two green LEDs and one blue LED, that is to say a total of four LEDs. Given correspondingly coordinated operating currents for the LEDs, each LED module intrinsically forms a white light source. It goes without saying that the LED modules are also suitable as color light sources, in particular for mixed-color light, the. LED modules advantageously having a high packing density in all cases and therefore being virtually point-like.

For the electrical supply of the individual LED modules, conductor tracks 24 are disposed between the LED modules 1. The operating current is impressed into the individual LEDs via wire connections 13. The direct current feeding enables the individual LED modules and, more widely, the individual LEDs to be driven and switched independently of one another. Of course, this does not preclude a series and/or parallel circuit of individual modules or LEDs if an independent control is not desired.

The conductor tracks 24 are preferably formed on a suitable conductor track carrier 25, for example a printed circuit board. A flexible printed circuit board or a corresponding printed circuit board sheet, for example a flexboard, is preferably used for this purpose.

The individual LED modules 1 are preferably disposed two-dimensionally and in matrix-like fashion on the heat sink. Thus, by way of example, 32 LED modules each having four LED chips may be combined on a common heat sink. In this case, the conductor track carrier 25 with the conductor tracks 24 applied thereto is expediently configured in the form of a lattice, the LED modules 1 being disposed in the lattice openings.

FIG. 6 illustrates a further exemplary embodiment of the invention. As in the exemplary embodiment shown in FIG. 5, a plurality of the LED modules 1 with the conductor tracks 24 disposed in between are mounted on the heat sink 3. The illustration shows in each case only the carrier 2 and the LEDs 11 of the LED modules 1. Specifically, it is possible to use a construction as in the case of the LED modules described previously. In contrast to the exemplary embodiment shown in FIG. 5, a reflector 26 is placed onto this configuration, which reflector 26 may bear for example on that side of the conductor track carrier 25 which is remote from the heat sink 3.

The reflector 26 has a plurality of perforations 27, side areas 28 of which are at least partially beveled and serve as reflection surfaces. In the plan view, the reflector 26 has a, for example lattice-like, font corresponding to the conductor track carrier 25. The reflector 26 advantageously increases the luminous efficiency of the LED modules.

Figure 7A:
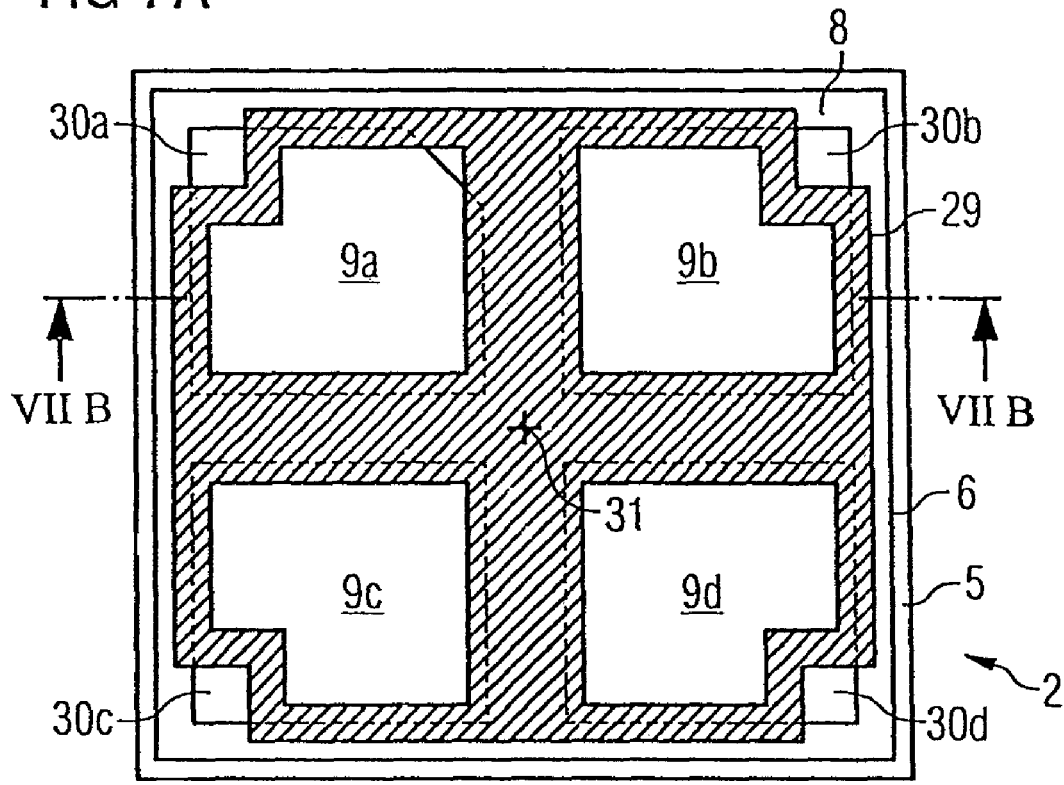
FIG. 7A is a diagrammatic, plan view of an exemplary embodiment of a carrier for the LED module according to the invention.
Figure 7B:
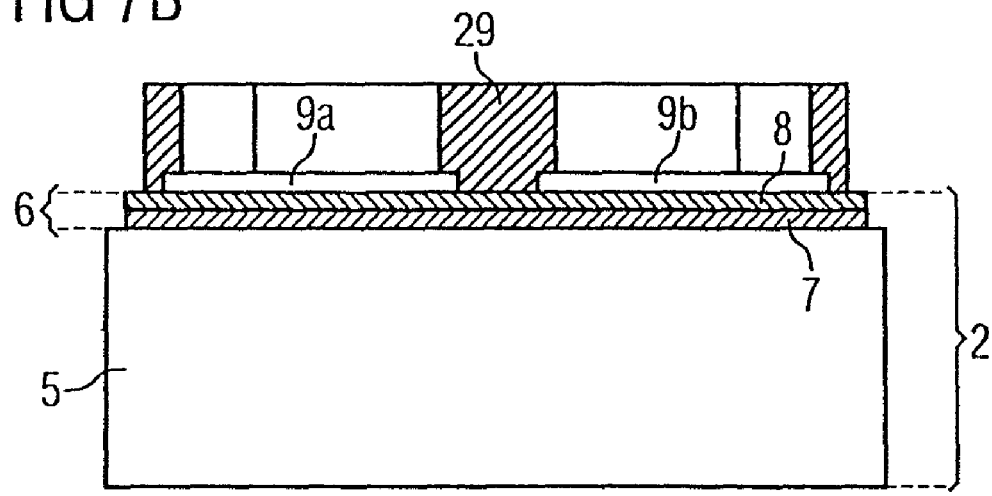
FIG. 7B is a diagrammatic, sectional view of an exemplary embodiment of the carrier for the LED module according to the invention.

FIG. 7A illustrates a plan view of the carrier 2 for an LED module having four LEDs. Such LED modules may be used for example in the exemplary embodiments shown in FIGS. 5 and 6. FIG. 7B shows an associated view of a section taken along the line VIIB-VIIB. For the sake of clarity, the layer thicknesses, in particular, are not illustrated true to scale.

As already described, the carrier 2 contains the semiconductor layer 5, preferably containing silicon or gallium arsenide, and also the insulating layer 6, which may again have the silicon oxide layer 7 and the silicon nitride layer 8.

Disposed on the insulating layer 6 are four metal areas 9a, 9b, 9c and 9d, for example made of aluminum, which are electrically insulated and spaced apart from one another and are enclosed by a frame-like structure 29. As already described, non-illustrated chip connection regions for the mounting of the LEDs may be formed on the metal areas.

The frame-like structure 29 is formed in elevated fashion, for example with a thickness of up to 30 μm, in particular between 5 μm and 25 μm, and serves as a collecting reservoir for adhesion agents such as silver conductive adhesive which are used for the mounting of the LEDs. In this case, the frame-like structure 29 forms a trough-like reservoir around each metal area or each chip connection region, which reservoir prevents excess adhesion agent from spilling over to the adjacent metal area and thus prevents a short circuit from arising between the individual LEDS.

Such frame-like structures may be produced for example from a plastic, preferably polyimide, by a corresponding plastic layer being applied and structured by processes of semiconductor technology.

The frame-like structure 29 is configured such that it is spaced apart further from the corners of the carrier and drawn back toward a carrier center 31, so that, as seen from the carrier center 31, partial regions 30a, 30b, 30c and 30d of the metal layers 9a, 9b, 9c and 9d are uncovered outside the frame-like structure 29. The partial regions 30a, 30b, 30c and 30d serve as connection points for external wire connections, for example with respect to the conductor tracks shown in FIGS. 5 and 6, each partial region being electrically conductively connected to the associated metal area.

It goes without saying that the explanation of the invention on the basis of the exemplary embodiments described is not to be understood as a restriction of the invention.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. An LED module, comprising:
 a carrier having a first main area, a second main area, and at least one semiconductor layer comprising a semiconductor material, said first main area having a planar configuration;
 a plurality of conductive regions formed on said first main area of said carrier;
 a plurality of LED semiconductor bodies applied on said plurality of conductive regions;
 a frame-like structure being formed on said first main area and enclosing the conductive regions; and
 chip connection regions formed on said conductive regions, said LED semiconductor bodies being disposed on said chip connection regions,
 wherein each of said chip connection regions is formed as a stack of thin metal layers.

2. The LED module according to claim 1, wherein said frame-like structure forms a trough-like reservoir.

3. The LED module according to claim 2, wherein the trough-like reservoir is formed around each conductive region.

4. The LED module according to claim 1, wherein said frame-like structure is formed in elevated fashion.

5. The LED module according to claim 1, wherein said frame-like structure partly covers said plurality of conductive regions.

6. The LED module according to claim 1, wherein said frame-like structure comprises a plastic.

7. The LED module according to claim 1, wherein said carrier has and is bounded by at least one electrical insulating layer on a side of said first main area, said conductive regions being arranged on the insulating layer.

8. The LED module according to claim 7, wherein said electrical insulating layer is formed in a multilayered fashion.

9. The LED module according to claim 1, wherein said semiconductor layer contains a material selected from the group consisting of silicon and gallium arsenide.

10. The LED module according to claim 1, wherein said conductive regions have a high reflectivity in a spectral region of radiation emitted by said LED semiconductor bodies.

11. The LED module according to claim 7, wherein said conductive regions are formed from aluminum.

12. The LED module according to claim 1, wherein said thin metal layers contain materials selected from the group consisting of titanium, copper, gold, platinum and other noble metals.

13. The LED module according to claim 1, further comprising a heat sink connected to said carrier on said second main area.

14. The LED module according to claim 13, wherein said heat sink is formed of a material selected from the group consisting of copper and aluminum.

15. The LED module according to claim 13, wherein said heat sink adjoins said semiconductor layer.

16. The LED module according to claim 13, further comprising a soldering compound connecting said heat sink to said semiconductor layer.

17. The LED module according to claim 1, wherein said LED semiconductor bodies are disposed on said carrier in a matrix form.

18. The LED module according to claim 1, wherein said LED semiconductor bodies emit light of differing central wavelengths during operation.

19. The LED module according to claim 18, wherein the light emitted by individual ones of said LED semiconductor bodies during operation has central wavelengths in the red, green or blue spectral region.

20. The LED module according to claim 17, wherein said LED semiconductor bodies with a same central wavelength in each case are disposed regularly on said carrier.

21. The LED module according to claim 17, wherein said LED semiconductor bodies are disposed in a periodically recurring sequence with regard to the central wavelengths in matrix rows.

22. The LED module according to claim 21, wherein a configuration of said LED semiconductor bodies in said matrix rows have a same periodically recurring sequence with regard to the central wavelengths.

23. The LED module according to claim 20, wherein said LED semiconductor bodies with a same central wavelength are in each case disposed in matrix columns.

24. The LED module according to claim 22, wherein a configuration of said LED semiconductor bodies in said matrix rows with an odd row number is identical and said configuration in said matrix rows with an even row number emerges from an overlying matrix row by displacement by one column width toward the left or toward the right.

25. The LED module according to claim 1, wherein said LED semiconductor bodies are one of soldered on and adhesively bonded on using an adhesion agent.

26. The LED module according to claim 25, wherein said adhesion agent is electrically conductive.

27. The LED module according to claim 25, wherein said adhesion agent is selected from the group consisting of a solder, an adhesive, and a silver conductive adhesive.

28. The LED module according to claim 13, further comprising a thermally conductive adhesive connecting said heat sink to said semiconductor layer.

29. An LED module, comprising:
a carrier having a first main area, a second main area, and at least one semiconductor layer comprising a semiconductor material, said first main area having a planar configuration;
a plurality of conductive regions formed on said first main area of said carrier;
a plurality of LED semiconductor bodies applied on said plurality of conductive regions;
a frame-like structure being formed on said first main area and enclosing the conductive regions;
a heat sink connected to said carrier on said second main area; and
a soldering compound connecting said heat sink to said semiconductor layer.

30. The LED module according to claim 29, wherein said frame-like structure forms a trough-like reservoir.

31. The LED module according to claim 30, wherein the trough-like reservoir is formed around each conductive region.

32. The LED module according to claim 29, wherein said frame-like structure is formed in elevated fashion.

33. The LED module according to claim 29, wherein said frame-like structure partly covers said plurality of conductive regions.

34. The LED module according to claim 29, wherein said carrier has and is bounded by at least one electrical insulating layer on a side of said first main area, said conductive regions being arranged on the insulating layer.

35. An LED module, comprising:
a carrier having a first main area, a second main area, and at least one semiconductor layer comprising a semiconductor material, said first main area having a planar configuration;
a plurality of conductive regions formed on said first main area of said carrier;
a plurality of LED semiconductor bodies applied on said plurality of conductive regions;
a frame-like structure being formed on said first main area and enclosing the conductive regions;
a heat sink connected to said carrier on said second main area; and
a thermally conductive adhesive connecting said heat sink to said semiconductor layer.

36. The LED module according to claim 35, wherein said frame-like structure forms a trough-like reservoir.

37. The LED module according to claim 36, wherein the trough-like reservoir is formed around each conductive region.

38. The LED module according to claim 35, wherein said frame-like structure is formed in elevated fashion.

39. The LED module according to claim 35, wherein said frame-like structure partly covers said plurality of conductive regions.

40. The LED module according to claim 35, wherein said carrier has and is bounded by at least one electrical insulating layer on a side of said first main area, said conductive regions being arranged on the insulating layer.

* * * * *